United States Patent
Kim et al.

(10) Patent No.: US 8,131,897 B2
(45) Date of Patent: Mar. 6, 2012

(54) SEMICONDUCTOR MEMORY DEVICE INPUTTING AND OUTPUTTING A PLURALITY OF DATA LENGTH FORMATS AND METHOD THEREOF

(75) Inventors: Soo-Young Kim, Hwaseong-si (KR); Mi-Jo Kim, Suwon-si (KR); Jung-Soo Ryoo, Seongnam-si (KR)

(73) Assignee: Samsung Electronics Co., Ltd., Gyeonngi-Do (KR)

( * ) Notice: Subject to any disclaimer, the term of this patent is extended or adjusted under 35 U.S.C. 154(b) by 1299 days.

(21) Appl. No.: 11/806,585

(22) Filed: Jun. 1, 2007

(65) Prior Publication Data

US 2008/0126604 A1     May 29, 2008

(30) Foreign Application Priority Data

Nov. 29, 2006  (KR) .................. 10-2006-0118964

(51) Int. Cl.
  *G06F 13/12*  (2006.01)
  *G06F 13/00*  (2006.01)
(52) U.S. Cl. ............... 710/66; 710/3; 710/5; 710/52; 711/100
(58) Field of Classification Search ............ None
  See application file for complete search history.

(56) References Cited

U.S. PATENT DOCUMENTS

| | | |
|---|---|---|
| 6,310,818 B1 | 10/2001 | Mukai |
| 6,401,175 B1 | 6/2002 | Tremblay et al. |
| 6,711,086 B2 | 3/2004 | Terada |
| 6,757,761 B1 | 6/2004 | Smith et al. |
| 2004/0230765 A1* | 11/2004 | Funahashi et al. ............ 711/201 |
| 2005/0002215 A1 | 1/2005 | Morishima |
| 2005/0066133 A1 | 3/2005 | Rao |
| 2006/0106988 A1* | 5/2006 | Khawand et al. ............ 711/130 |

FOREIGN PATENT DOCUMENTS

| | | |
|---|---|---|
| JP | 07-175713 | 7/1995 |
| JP | 2000-215659 | 8/2000 |
| JP | 2004-013980 | 1/2004 |
| JP | 2004-055130 | 2/2004 |
| JP | 2004-522238 | 7/2004 |
| JP | 2005-149575 | 6/2005 |
| JP | 2005-286277 | 10/2005 |
| KR | 10-0335455 | 4/2002 |
| KR | 10-0460108 | 11/2004 |
| KR | 2006-0043911 | 5/2006 |
| KR | 10-0745369 | 7/2007 |

OTHER PUBLICATIONS

Decision of Grant dated Mar. 26, 2008 issued in corresponding Korean Application No. 10-2006-0118964.

* cited by examiner

*Primary Examiner* — Alan Chen
(74) *Attorney, Agent, or Firm* — Harness, Dickey & Pierce, PLC

(57) ABSTRACT

A semiconductor memory device and method thereof are provided. The example semiconductor memory device may include a first processor configured to exchange data with a first data length format, a second processor configured to exchange data with a second data length format and a shared memory configured to store data, the shared memory being shared by the first and second processors, the shared memory further configured to receive a read command from at least one of the first and second processors and to output data in response to the read command based on which of the first and second data length formats is used by the processor issuing the read command.

31 Claims, 15 Drawing Sheets

| | x16 | x32 |
|---|---|---|
| Q0 | CA1 | CA1 |
| Q1 | CA2 | CA2 |
| Q2 | CA3 | CA3 |
| Q3 | CA4 | CA4 |
| Q4 | CA5 | CA5 |
| Q5 | CA6 | CA6 |
| Q6 | CA7 | CA7 |
| Q7 | CA8 | CA8 |
| Q8 | CA9 | CA0 |
| Q9 | CA0 | – |

*10b*

| | x16 | x32 |
|---|---|---|
| Q0 | CA2 | CA1 |
| Q1 | CA3 | CA2 |
| Q2 | CA4 | CA3 |
| Q3 | CA5 | CA4 |
| Q4 | CA6 | CA5 |
| Q5 | CA7 | CA6 |
| Q6 | CA8 | CA7 |
| Q7 | CA9 | CA8 |
| Q8 | CA0 | CA0 |
| Q9 | CA1 | – |

−1 shift

SEMICONDUCTOR MEMORY DEVICE INPUTTING AND OUTPUTTING A PLURALITY OF DATA LENGTH FORMATS AND METHOD THEREOF

PRIORITY STATEMENT

This U.S. nonprovisional patent application claims priority under 35 U.S.C. §119 of Korean Patent Applications 10-2006-0118964 filed on Nov. 29, 2006, the entire contents of which is hereby incorporated by reference.

BACKGROUND OF THE INVENTION

1. Field of the Invention

Example embodiments of the present invention relate generally to a semiconductor memory device and method thereof.

2. Description of the Related Art

A semiconductor memory device including a plurality of access ports may be referred to as a multiport memory. A memory device having two access ports may further be referred to as a dual-port memory. A conventional dual-port memory may be, for example, an image processing video memory having a random access memory (RAM) port accessible in a random sequence and a serial access memory (SAM) port accessible in a serial sequence.

A dynamic random access memory (DRAM) may read from or write to a shared memory area through a plurality of access ports in a memory cell array not having an SAM port, and may be called a multipath accessible semiconductor memory device, as distinguished from a multiport memory.

Conventional portable electronic systems, such as a handheld multimedia player or handheld phone, a notebook computer, a PDA, etc., may include multiprocessor systems employing plural processors, as shown in FIG. 1, in order to obtain higher performance.

FIG. 1 is a block diagram of a conventional multiprocessor system within a portable communication device.

Referring to FIG. 1, a first processor 10 and a second processor 12 may be connected through a connection line L10, and a NOR memory 14 and a DRAM 16 may be coupled with the first processor 10 through buses B1-B3, and a DRAM 18 and a NAND memory 20 may be coupled with the second processor 12 through buses B4-B6. The first processor 10 may have a MODEM function for performing a modulation and demodulation of a communication signal and the second processor 12 may have an application function for dealing with communication data, games, etc. A NOR memory 14 having a NOR structure with a cell array configuration, and a NAND memory 20 having a NAND structure with a cell array configuration, may each be nonvolatile memories having a transistor memory cell with a floating gate. The nonvolatile memory may be adapted to store data in a "solid state", such that data may be maintained even if a supply power is lost.

However, in a multi processor system such as illustrated in FIG. 1, DRAMs may correspond to and may be assigned to each processor, and lower-speed interfaces (e.g., UART, SPI, SRAM, etc.) may be used internally, such that a circuit complexity may be increased and an operational speed may be lower.

FIG. 2 is a block diagram of a conventional multiprocessor system including a semiconductor memory.

Referring to FIG. 2, a single DRAM 17 may be coupled to the first and second processors 10 and 12 through buses B1 and B2. The DRAM 17 may include two ports (e.g., one for each respective processor) to allow each processor 10 and 12 to access the DRAM 17 through each path in the structure of a multi processor system shown in FIG. 2. The two ports of the DRAM 17 may be connected to the first and second processors 10 and 12 via the buses B1 and B2, respectively.

FIG. 3 is a block diagram illustrating a conventional DRAM 1. In an example, the DRAM 1 may include a single port PO.

Referring to FIG. 3, the DRAM 1 may include a memory cell array having first to fourth banks 3, 4, 5 and 6, each corresponding to and connected with a row decoder 8 and a column decoder 7. An upper input/output sense amplifier and driver 13 may be operationally coupled to the first bank 3 or third bank 5 through multiplexer 11, 12, and a lower input/output sense amplifier and driver 13 may be operationally coupled to the second bank 4 or fourth bank 6 through multiplexer 14, 15.

Referring to FIG. 3, in an example, in selecting a memory cell of the first bank 3 and in reading data stored in the selected memory cell, an output procedure of the read data is as follows. A selected word line may be activated, and data of a memory cell may be sensed and amplified by a bit line sense amplifier and transferred to a local input/output line 9 according to an activation of corresponding column selection line CSL. Data transferred to the local input/output line 9 may be transferred to a global input/output line GIO by a switching operation of first multiplexer 21, and a second multiplexer 11 connected to global input/output line GIO may transfer data of the global input/output line GIO to the upper input/output sense amplifier and driver 13. The data may be sensed again and amplified by the upper input/output sense amplifier and driver 13 and may be output to a data output line L5 through a path unit 16.

Referring to FIG. 3, in another example, in reading data stored in a memory cell of the fourth bank 6, data may be output to an output terminal DQ, sequentially through a multiplexer 24, the multiplexer 14, the lower input/output sense amplifier and driver 13, the path unit 16 and the data output line L5. As described above, the DRAM 1 of FIG. 3 has a structure two banks share one input/output sense amplifier and driver, and is a single port memory an input/output of data is performed through one port PO. That is, the single-port DRAM 1 of FIG. 3 may be used within the system of FIG. 1, and may not be used within the multiprocessor system of FIG. 2 because the DRAM 1 includes a single port, and not dual ports.

FIG. 4 is a block diagram illustrating a conventional multiprocessor system 50.

Referring to FIG. 4, the multiprocessor system 50 may include a memory array 35 having first, second and third portions 33, 31 and 32, respectively. The first portion 33 of the memory array 35 may be accessed only by a first processor 70 through a port 37, and the second portion 31 may be accessed only by a second processor 80 through a port 38, and the third portion 32 may be accessed by each of the first and second processors 70 and 80. A size of the first and second portions 33 and 31 of the memory array 35 may vary based upon an operating load of the first and second processors 70 and 80, and the type of the memory array 35 may be either a memory type or disk storage type.

Referring to FIG. 4, the third portion 32 may be shared by the first and second processors 70 and 80 and the first and second portions 33 and 31, which may independently access the third portion 32 within the memory array 35. Assigning an appropriate read/write path control for respective ports may be an important design criterion. The bank address may indicate an address to select a given bank if a memory cell array is divided into a plurality of banks, and may be distinguished from a memory cell address to select a given memory cell from among a plurality of memory cells disposed in a matrix type. For example, if four memory banks (e.g., 00, 01, 10, 11) are included, four corresponding bank addresses (e.g., 00, 01, 10, 11) may be used to select from among the four memory banks.

In another example, even if the first processor writes data in a data input/output bit unit of 16 bits to the shared memory area through the first port, the second process may read data in a data input/output bit unit of 32 bits through the second port. Also, if the second processor writes data in a unit of 32 bits to the shared memory area, the first processor may read data in a unit of 16 bits. Thus, if the units of data input/output bit for respective ports are different, it may be difficult for the shared memory area to maintain data in a format compatible with both ports.

SUMMARY OF THE INVENTION

An example embodiment of the present invention is directed to a method of performing memory operations, including storing data in a shared memory, the shared memory being shared by a first processor configured to exchange data with a first data length format and a second processor configured to exchange data with a second data length format, receiving a read command from one of the first and second processors and outputting data from the shared memory in response to the read command based on which of the first and second data length formats is used by the processor issuing the read command.

Another example embodiment of the present invention is directed to a semiconductor memory device, including a first processor configured to exchange data with a first data length format, a second processor configured to exchange data with a second data length format and a shared memory configured to store data, the shared memory being shared by the first and second processors, the shared memory further configured to receive a read command from at least one of the first and second processors and to output data in response to the read command based on which of the first and second data length formats is used by the processor issuing the read command.

Another example embodiment of the present invention is directed to a multiprocessor system capable of accessing per port in an independent bit unit to a shared memory area and a private memory area within a multipath accessible semiconductor memory device.

Another example embodiment of the present invention is directed to a method of performing a data compatibility in a multipath accessible semiconductor memory device.

Another example embodiment of the present invention is directed to a multipath accessible semiconductor memory device capable of achieving a compatibility of data even when data input/output units for respective ports are independent from each other.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 10 is illustrates an address bit shifting of an address coding shifter of the multipath accessible semiconductor memory device of FIG. 9 according to another example embodiment of the present invention.

DETAILED DESCRIPTION OF EXAMPLE EMBODIMENTS

Figure 1:
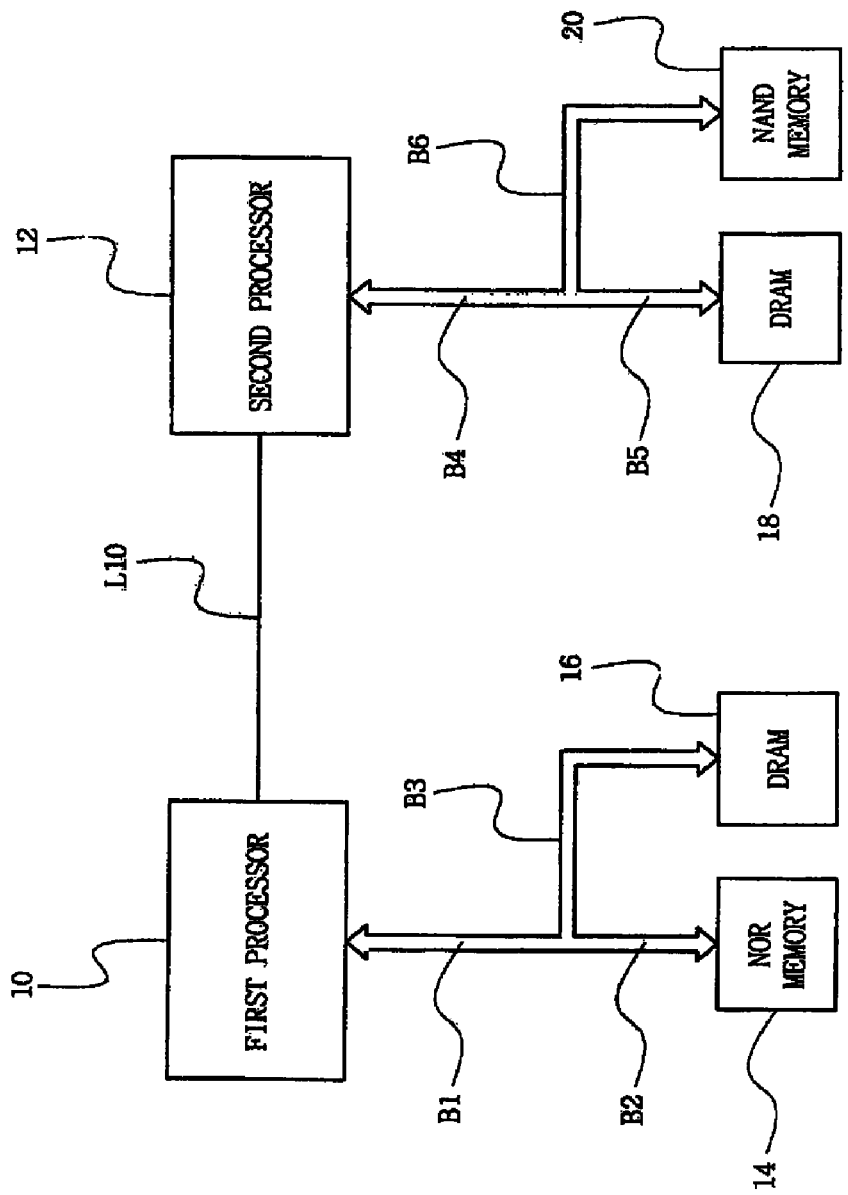
FIG. 1 is a block diagram of a conventional multiprocessor system within a portable communication device.
Figure 2:
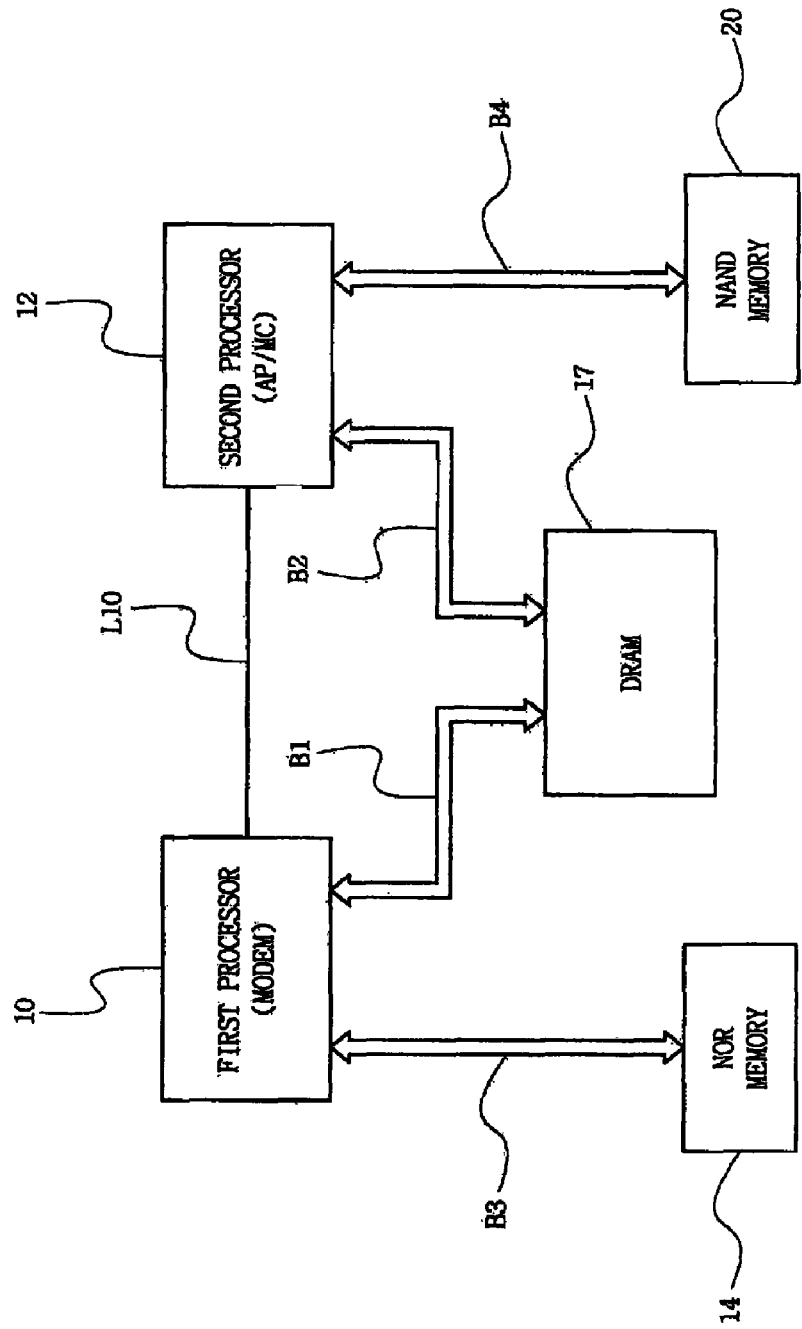
FIG. 2 is a block diagram of a conventional multiprocessor system including a semiconductor memory.
Figure 3:
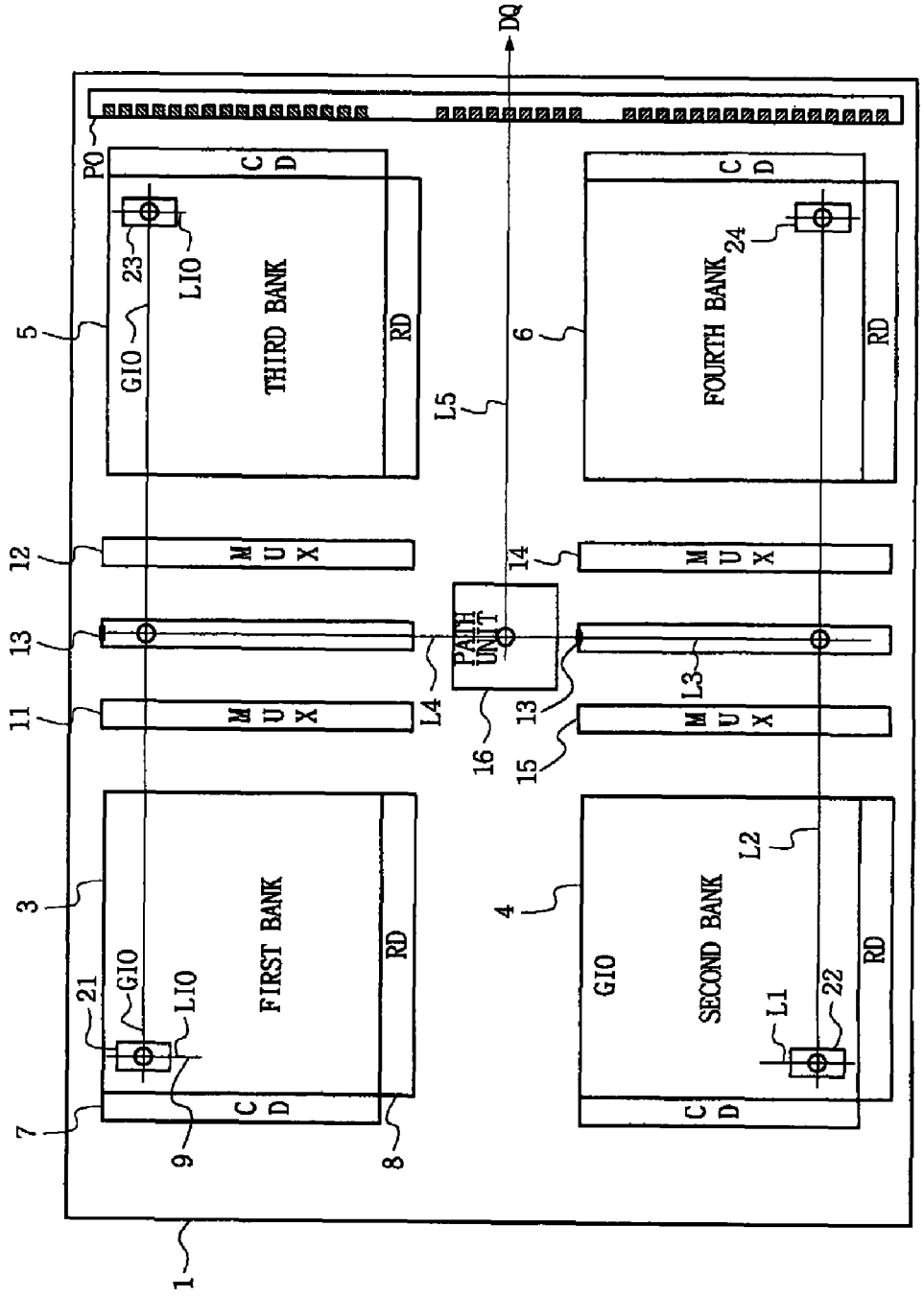
FIG. 3 is a block diagram illustrating a conventional dynamic random access memory (DRAM).
Figure 4:
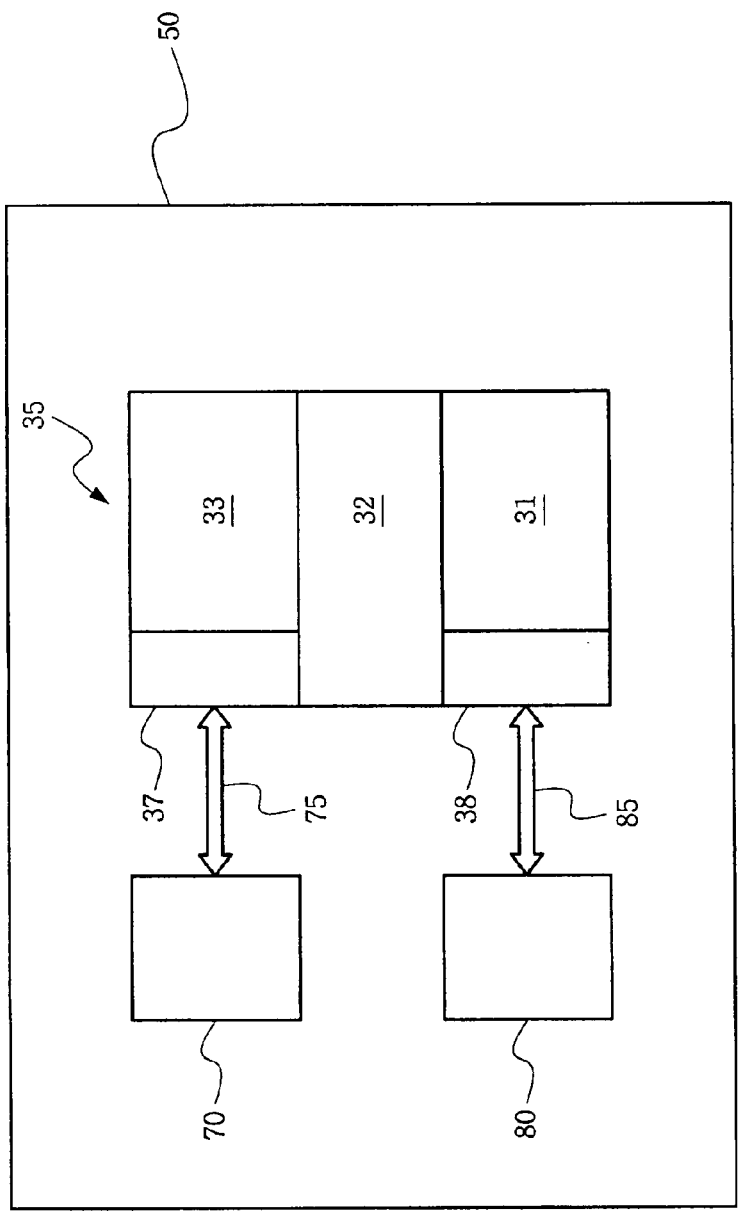
FIG. 4 is a block diagram illustrating a conventional multiprocessor system.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises" , "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

For purposes of clarity, a detailed description of known functions and systems for, for example, other illuminations, publishing methods, a decoding for addresses, accessing procedures, general dynamic random access memories and circuits, has been omitted.

Figure 5:
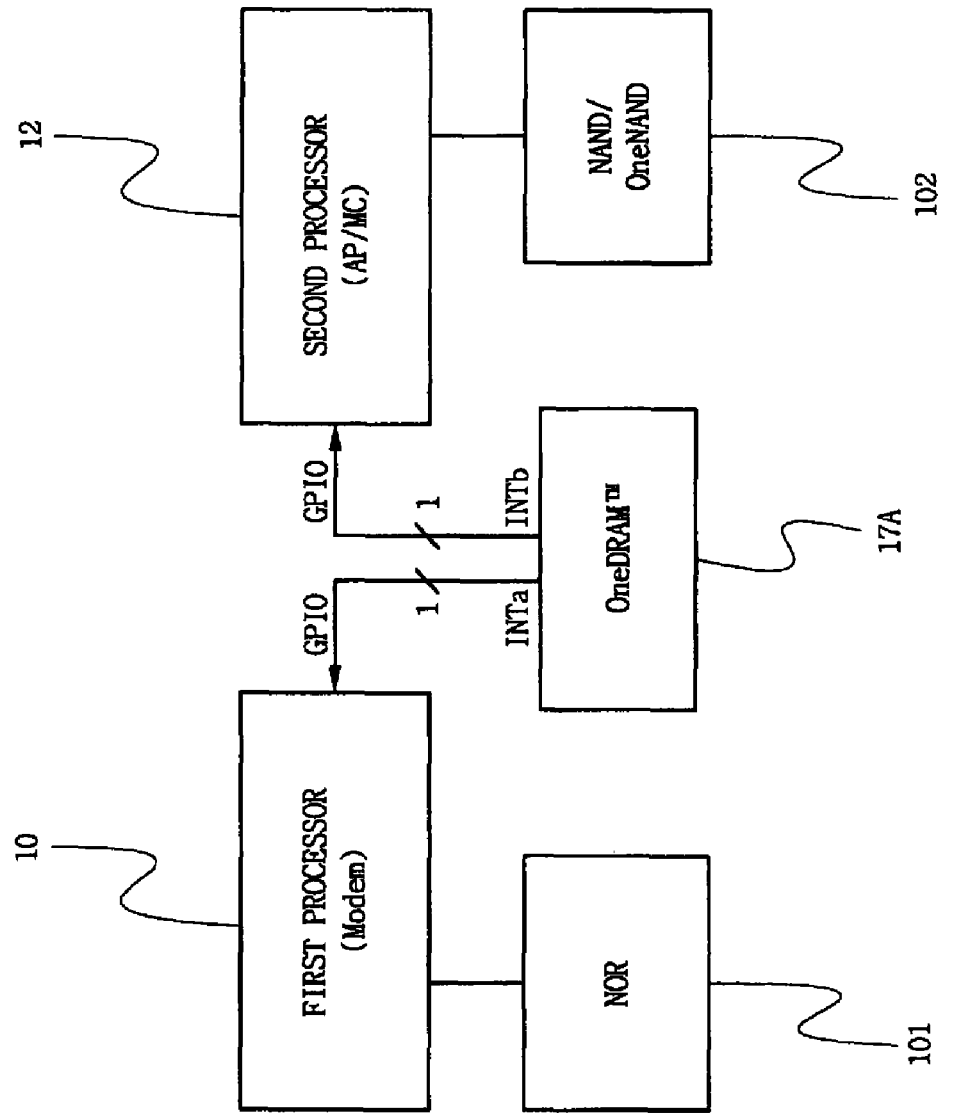
FIG. 5 is a block diagram illustrating a multiprocessor system according to an example embodiment of the present invention.

FIG. 5 is a block diagram illustrating a multiprocessor system according to an example embodiment of the present invention.

In the example embodiment of FIG. 5, the multiprocessor system, such as a data processing system or portable communication system, may include a first processor 10 for performing a first task, a second processor 12 for performing a second task, and a dynamic random access memory (DRAM) 17A having memory areas accessed by the first and second processors 10 and 20 within a memory cell array. The multiprocessor system may further include flash memories 101 and 102 connected with the first, second processor 10, 12.

In the example embodiment of FIG. 5, the DRAM 17A may be shown as including two independent ports, although it is understood that other example embodiments of the present invention may be directed to DRAMs, or other memory device types, having any number of ports. The DRAM 17A may include a port A, or first port through which an output signal INTa is output and a port B, or second port through which an output signal INTb is output. The first port may be connected to the first processor 10 through a general-purpose input/output (GPIO) line, and the second port may be connected to the second processor 12 through a general-purpose input/output (GPIO) line. In an example, the first processor 10 may have, as a processing task, a MODEM function of performing a modulation and demodulation of a communication signal, or alternatively a baseband processing function. The second processor 12 may have, as a processing task, an application function to process communication data (e.g., a game, a moving image, etc.). In another example, the second processor 12 may be a multimedia coprocessor.

In the example embodiment of FIG. 5, the flash memories 101 and 102 may be nonvolatile memories having, for example, a NOR or NAND structure, respectively, in a cell connection configuration of a memory cell array, and in which a memory cell may include a MOS transistor having a floating gate. The flash memories 101 and 102 may be mounted to store data in a "solid state", or data that may be retained even if a continuous power supply is not available.

In the example embodiment of FIG. 5, the DRAM 17A may be used to store commands and data to be executed in the processors 10 and 12. Further, the DRAM 17A may manage an interface function between the first and second processors 10 and 12. The processors 10 and 12 may perform a data communication through a commonly accessible shared memory area by using an interface unit within a DRAM having a semaphore area and mailbox areas. If a host interface between processors is provided in a memory, a plurality of processors may access an assigned shared memory area at a higher speed, thereby enhancing a data transmission and processing speed of a given system.

In the example embodiment of FIG. 5, the multiprocessor system may correspond to a portable computing device or portable communication device such as a mobile communication device (e.g., a cellular phone, a bidirectional radio communication system, a single-directional pager, a bidirectional pager, a personal communication system, a portable computer, etc.). However, it will be appreciated that other example embodiments of the present invention may deploy the multiprocessor system of FIG. 5 in any well-known multiprocessor system configuration.

In the example embodiment of FIG. 5, while two processors are illustrated, the number of processors may scale to any number of processors. The processors 10 and 12 may correspond to a microprocessor, CPU, digital signal processor, micro controller, reduced command set computer, complex command set computer, etc. However, it will be appreciated that other example embodiments of the present invention may include any well-known type of processor and/or any well-known combination of processors.

Examples of layouts for a plurality of memory banks included within the DRAM 17A of FIG. 5 will now be described in greater detail.

Figure 6:
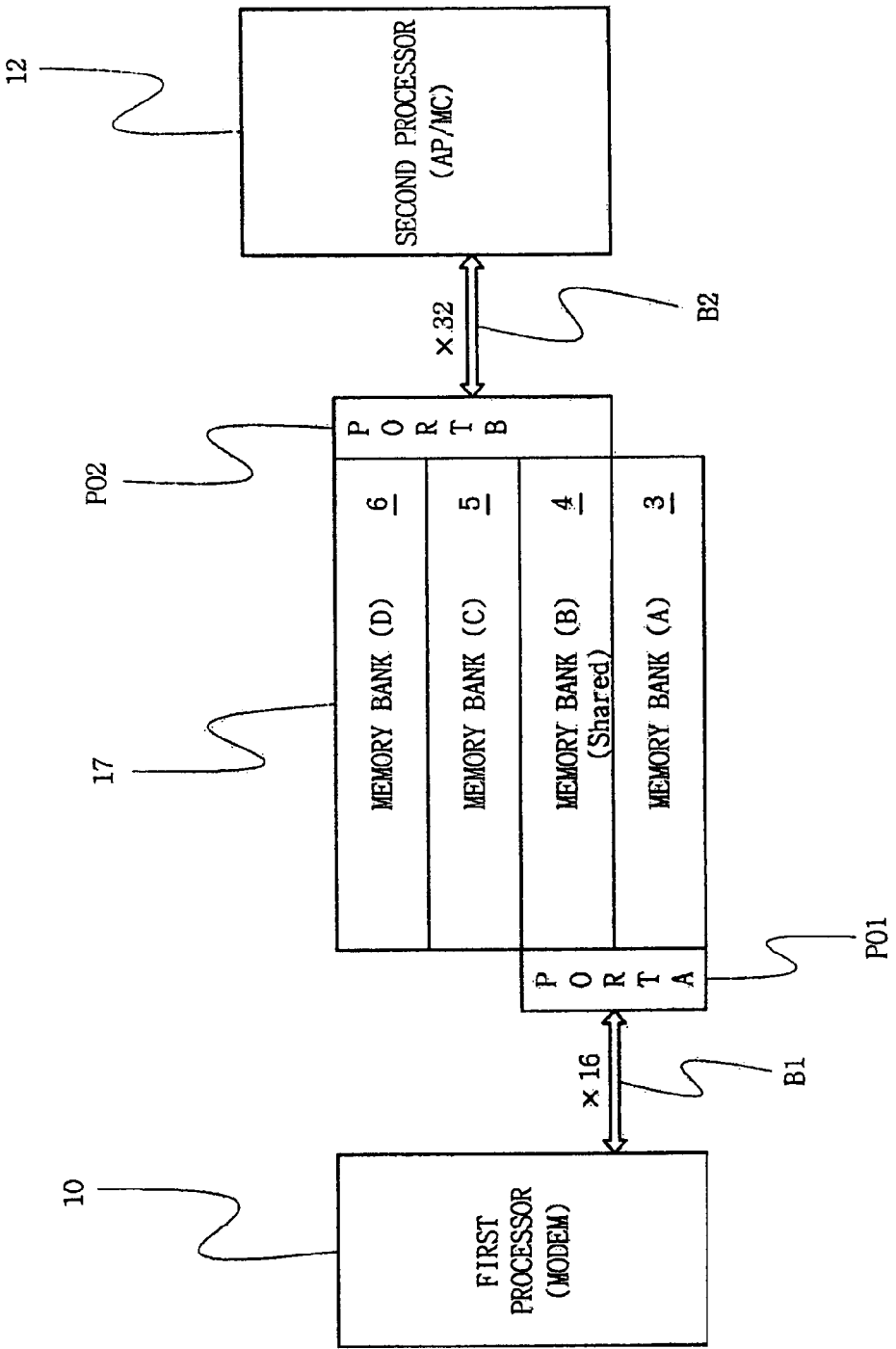
FIG. 6 is a block diagram of a memory layout of the multiprocessor system of FIG. 5 according to another example embodiment of the present invention.

FIG. 6 is a block diagram of a memory layout of the multiprocessor system of FIG. 5 according to another example embodiment of the present invention.

In the example embodiment of FIG. 6, four memory banks 3, 4, 5 and 6 may be disposed within the DRAM 17A, although it is understood that other example embodiments of the present invention may be directed to DRAMs having any number of memory banks. The memory bank A, 3 may be accessed by the first processor 10 through a first port PORT A, PO1, and the memory banks C, 5 and D, 6 may be accessed by a second processor 12 through a second port PORT B, PO2. The memory bank B, 4 may be accessed by each of the first and second processors 10 and 12 through the first and second ports PO1 and PO2. The memory bank B, 4 may be a shared memory area, and the memory banks A, 3, C, 5 and D, 6 may be "private" (e.g., non-shared) memory areas accessible by a single corresponding processor. In an example, the first port PO1 may be compatible with data input/output in first units (e.g., units of 16 bits), whereas the second port PO2 may be compatible with data input/output in second units (e.g., units of 32 bits). In an example, the first processor 10 may have an operating system compatible executing instructions having a first length (e.g., 16 bits) and the second processor 12 may have an operating system executing instructions having a second length (e.g., 32 bits).

Each of the four memory areas 3, 4, 5 and 6 may correspond to a unit of a bank in each DRAM 17A, with each bank having a memory storage of, for example, 64 MB, 128 MB, 256 MB, 512 MB, 1024 MB, etc.

In the example embodiment of FIG. 6, the first memory bank 3 may be coupled to first processor 10 through first port PO1, the second and fourth memory banks 5 and 6 may be coupled to second processor 12 through second port PO2, and a third memory bank 4 shared by and connected with the first and second processors 10 and 12 through the first and second ports PO1 and PO2. During a reading of data stored in the shared memory bank at corresponding processors by mutually different data input/output units (e.g., 16 bits, 32 bits, etc.), examples of maintaining compatibility of data having potentially different units will be described in greater detail below with reference to the example embodiments of FIGS. 7 through 15.

While example embodiments of the present invention described below are related to compatibility of data read in a data input/output unit of 32 bits or 16 bits through each port, respectively, the data being stored in the shared memory bank 4 of FIG. 6 by a data input/output unit of 16 bits or 32 bits, it is understood that other example embodiments of the present invention may be directed to data compatibility with other data units, such as 8 bits, 64 bits, etc.

Figure 7:
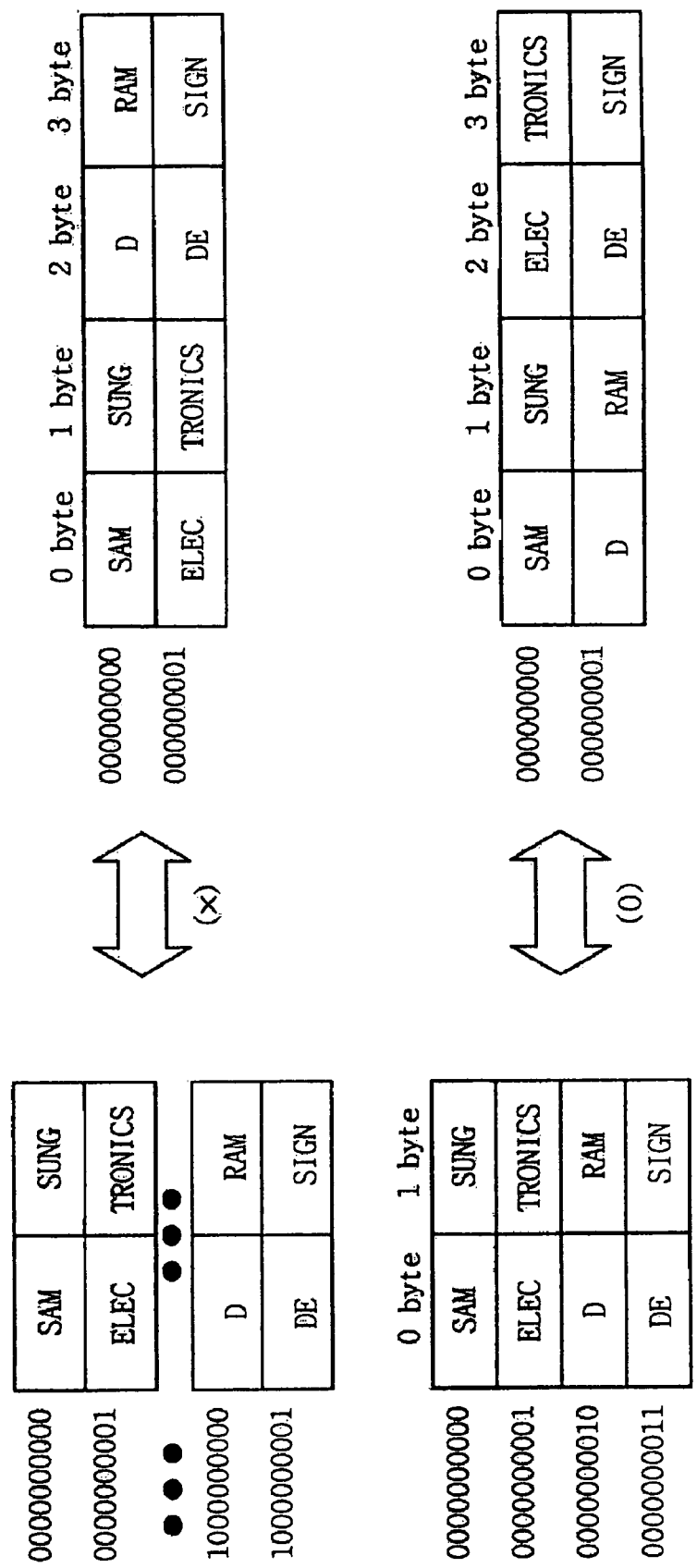
FIG. 7 illustrates a compatibility of data per port on the shared memory bank of FIG. 6 according to an example embodiment of the present invention.

FIG. 7 illustrates a compatibility of data per port on the shared memory bank of FIG. 6 according to an example embodiment of the present invention.

In the example embodiment of FIG. 7, the "upper" portion may indicate a data compatibility result through conventional coding and the "lower" portion may indicate a data compatibility result through coding according to example embodiments of the invention. The "left" portion may indicate data constructed of a data input/output bit unit of 16 bits (hereinafter, referred to as 'x16'), and the "right" portion may indicate data constructed of a data input/output bit unit of 32 bits (hereinafter, referred to as 'x32').

In the example embodiment of FIG. 7, in an example, if the first processor 10 of FIG. 6 writes, by x16, data to the shared memory bank 4 through the first port PO1 and the second processor 12 reads, by x32, data through the second port PO2, the differently sized data units may remain compatible, as shown in the lower portion of FIG. 7. For example, if data string "Samsung Electronics" based on "0000000000" and "0000000001" as column addresses of x16 is read by x32, the coding may correspond to a column address "000000000" of x32. In other words, the data string "Samsung Electronics" may be obtained via a single 32 bit data transfer. If the coding is performed as shown in the upper drawing of FIG. 7, a data string "Samsung DRAM" may be read (e.g., instead of "Samsung Electronics"), such that it may be difficult to achieve compatibility with the "intended" data string.

In the example embodiment of FIG. 7, if the second processor 12 writes, by x32, data to the shared memory bank 4 and the first processor 10 reads data by x16, the data string "Samsung Electronics" corresponding to the column address "000000000" of x32 may be divided into "0000000000" and "0000000001" of the column addresses of x16, and as such the data string "Samsung Electronics" may be partitioned into separate data strings (e.g., "Samsung" and "Electronics"). Thus, even if the data input/output bit units are different for respective ports, the data (e.g., data strings) may remain compatible within a shared memory region accessible to each respective port.

Figure 8:
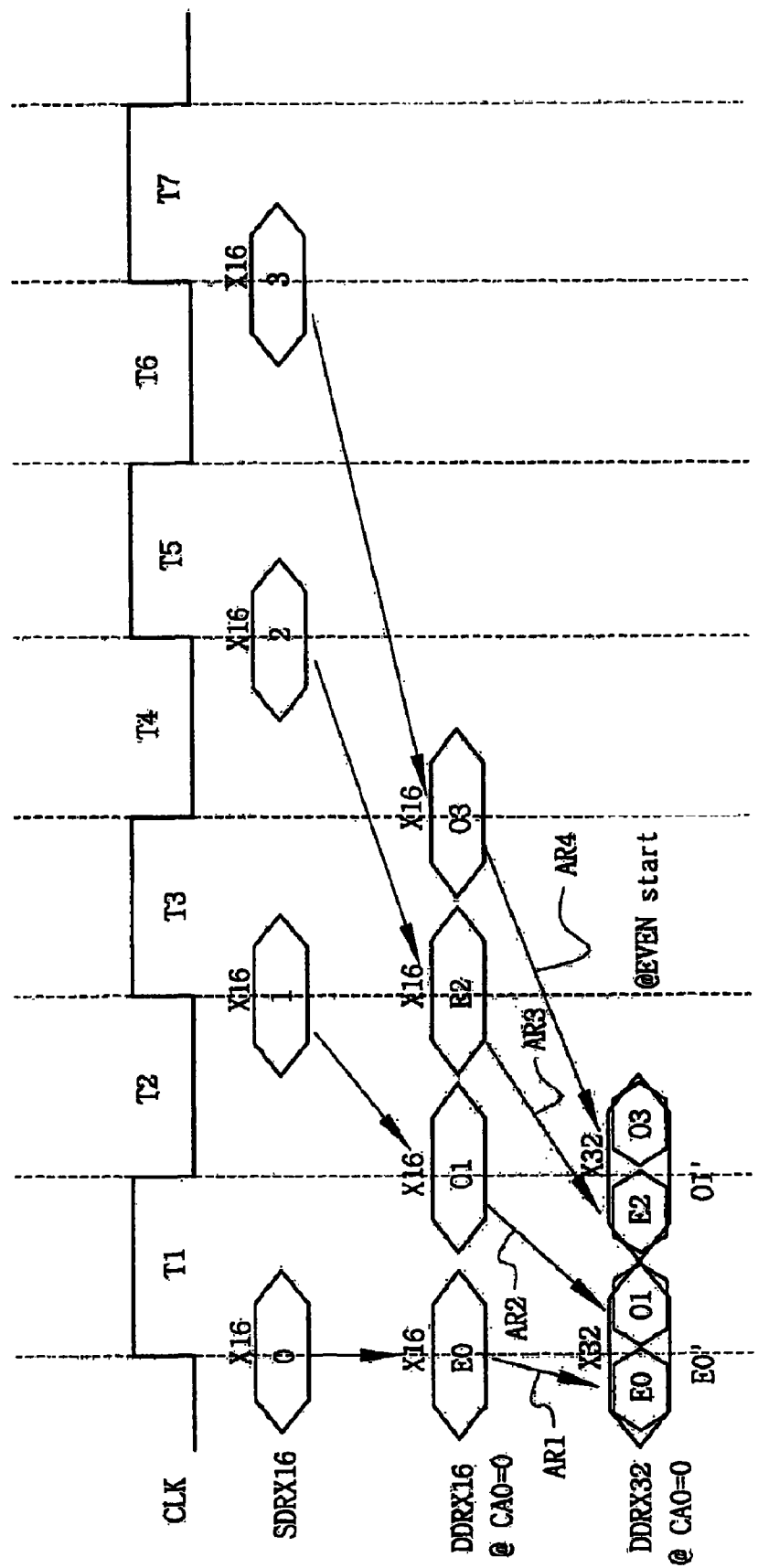
FIG. 8 illustrates a timing per time interval in a data input/output bit unit per port according to other example embodiments of the present invention.

FIG. 8 illustrates a timing per time interval in a data input/output bit unit per port according to other example embodiments of the present invention.

In the example embodiment of FIG. 8, if a system clock CLK is set to a first logic level (e.g., a higher logic level or logic "1") in time intervals T1, T3, T5, and T7 and a second logic level (e.g., a lower logic level or logic "0") in time intervals T2, T4 and T6. Example output timings for data of single data rate (SDR) x16, double data rate (DDR) x16, and DDR x32 are illustrated in FIG. 8. SDR may denote an operating mode in which logic levels of data are determined once per clock cycle of the system clock CLK, and DDR may denote an operating mode in which logic levels of data are determined twice per clock cycle. For example, in DDRx16, data of 16 bits may be read at a rising edge of the system clock, and data of 16 bits may also be read at a falling edge of the system clock. During a read operation, by x32, of data stored in DDRx16, a first even data E0 and a first odd data O1 of DDRx16 may be combined as a first even data E0' in DDRX32 and then outputted as shown in FIG. 8. Likewise, a second even data E2 and a second odd data O3 of DDRx16 may be combined as a second odd data O1' in DDRX32 and then outputted. The example embodiment of FIG. 8 illustrates a case where the start data has an "even" start (e.g., with the rising edge of the clock), while it is understood that other example embodiments of the present invention need not be so limited.

In the example embodiment of FIG. 8, in order to achieve data compatibility between x16 and x32 (e.g., to achieve the results shown in the lower portion of the example embodiment of FIG. 7), in a first example, a bit shifting for a column address of x16 or x32 applied in the read operation may be performed according to a "magnitude" of data input/output bit (e.g., whether data is to be output in an x16 data length format, an x32 data length format, etc.). In a second example, an output connection of an input/output sense amplifier for providing sense amplification output data may be converted according to a magnitude of the data input/output bit. In a third example, an output sequence of the input/output sense amplifier for providing sense amplification output data in a read operating mode may be adjusted based on a received external command.

Figure 9:
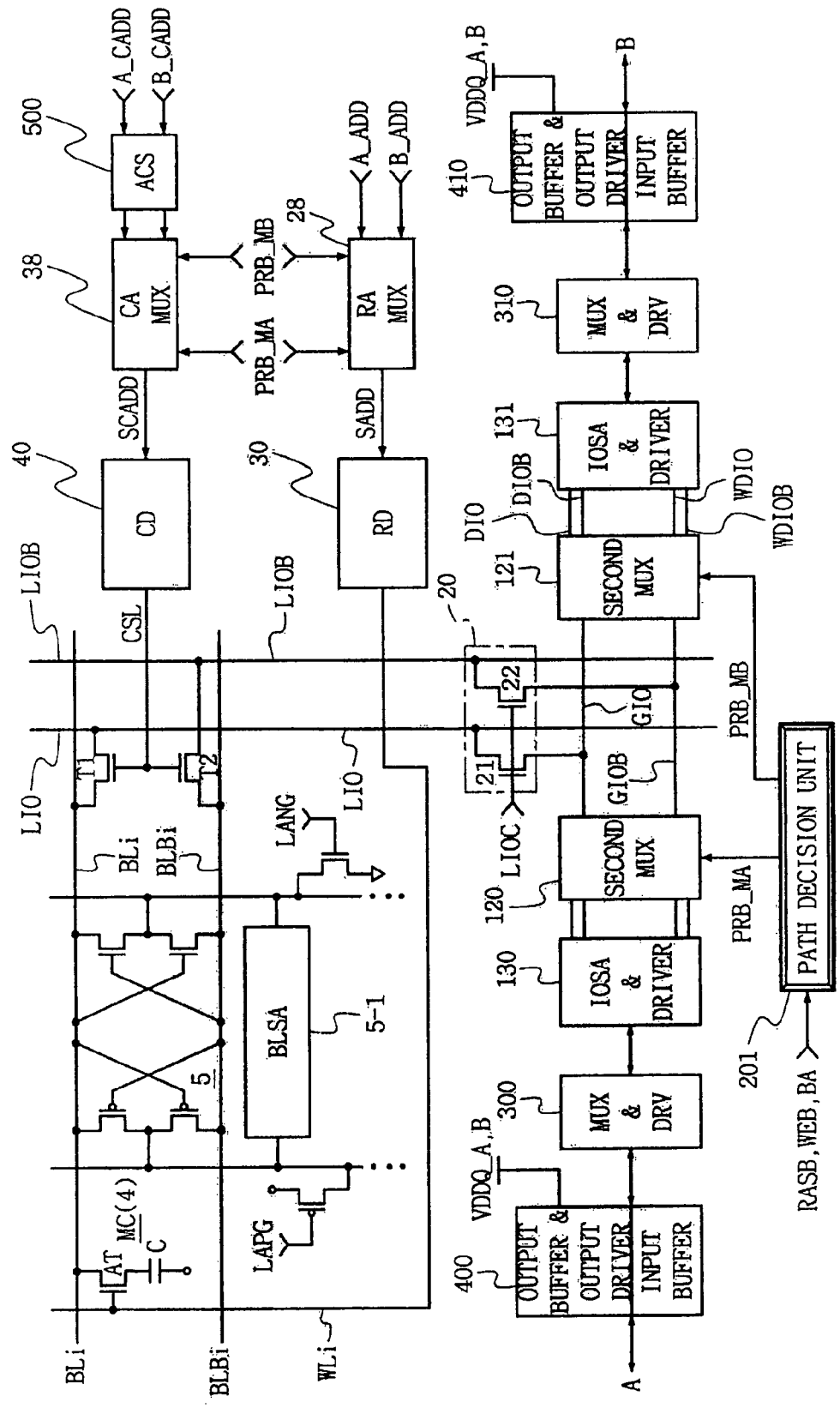
FIG. 9 is a block diagram of a multipath accessible semiconductor memory device according to an example embodiment of the invention.

FIG. 9 is a block diagram of a multipath accessible semiconductor memory device according to an example embodiment of the invention.

FIG. 10 is illustrates an address bit shifting of an address coding shifter of the multipath accessible semiconductor memory device of FIG. 9 according to another example embodiment of the present invention. In particular, FIG. 10 illustrates a conventional table 10a and a table 10b according to an example embodiment of the present invention.

Figure 11:
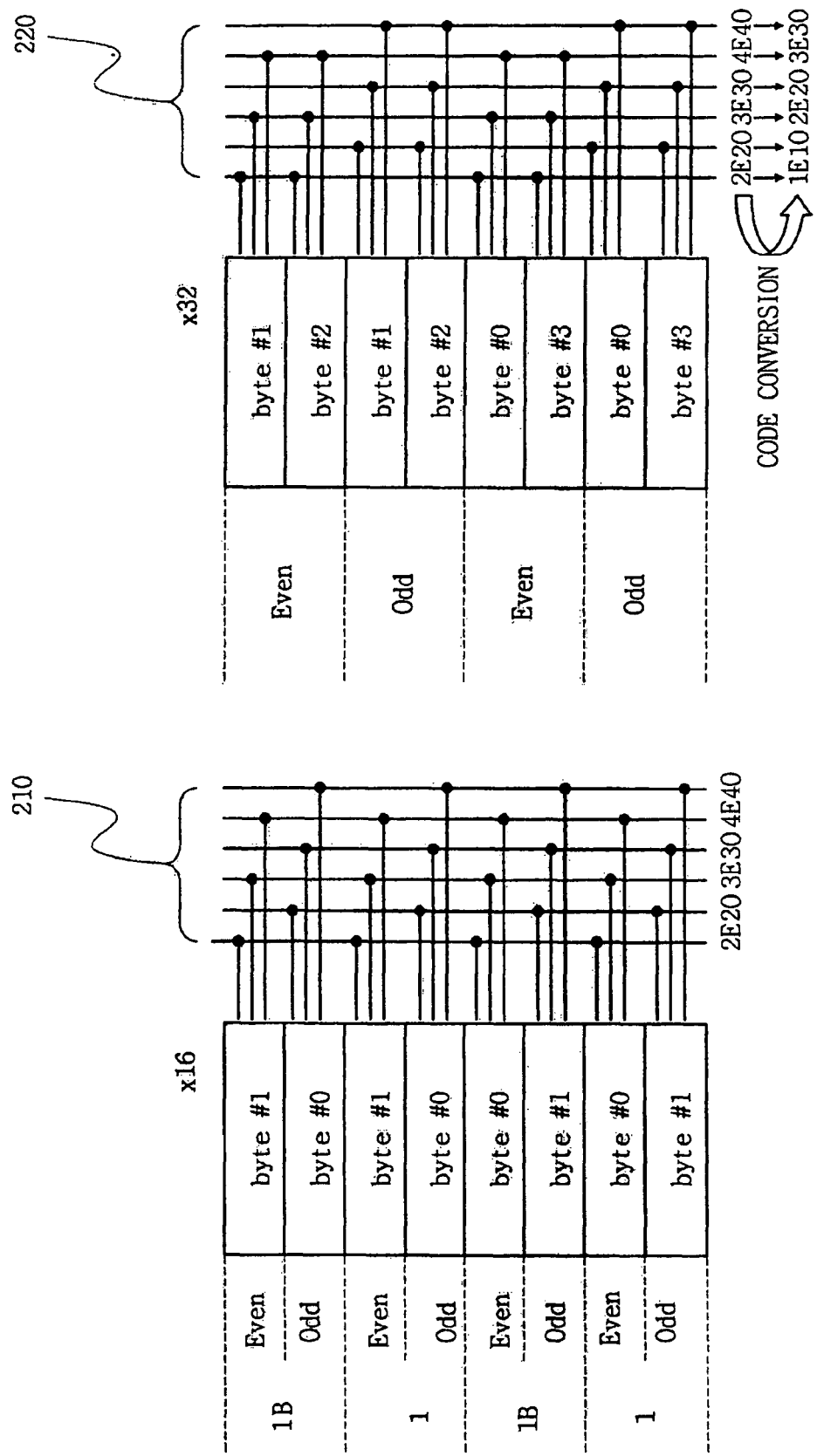
FIGS. 11 and 12 illustrate configurations of the address coding shifter of FIG. 9 according to other example embodiments of the present invention.
Figure 12:
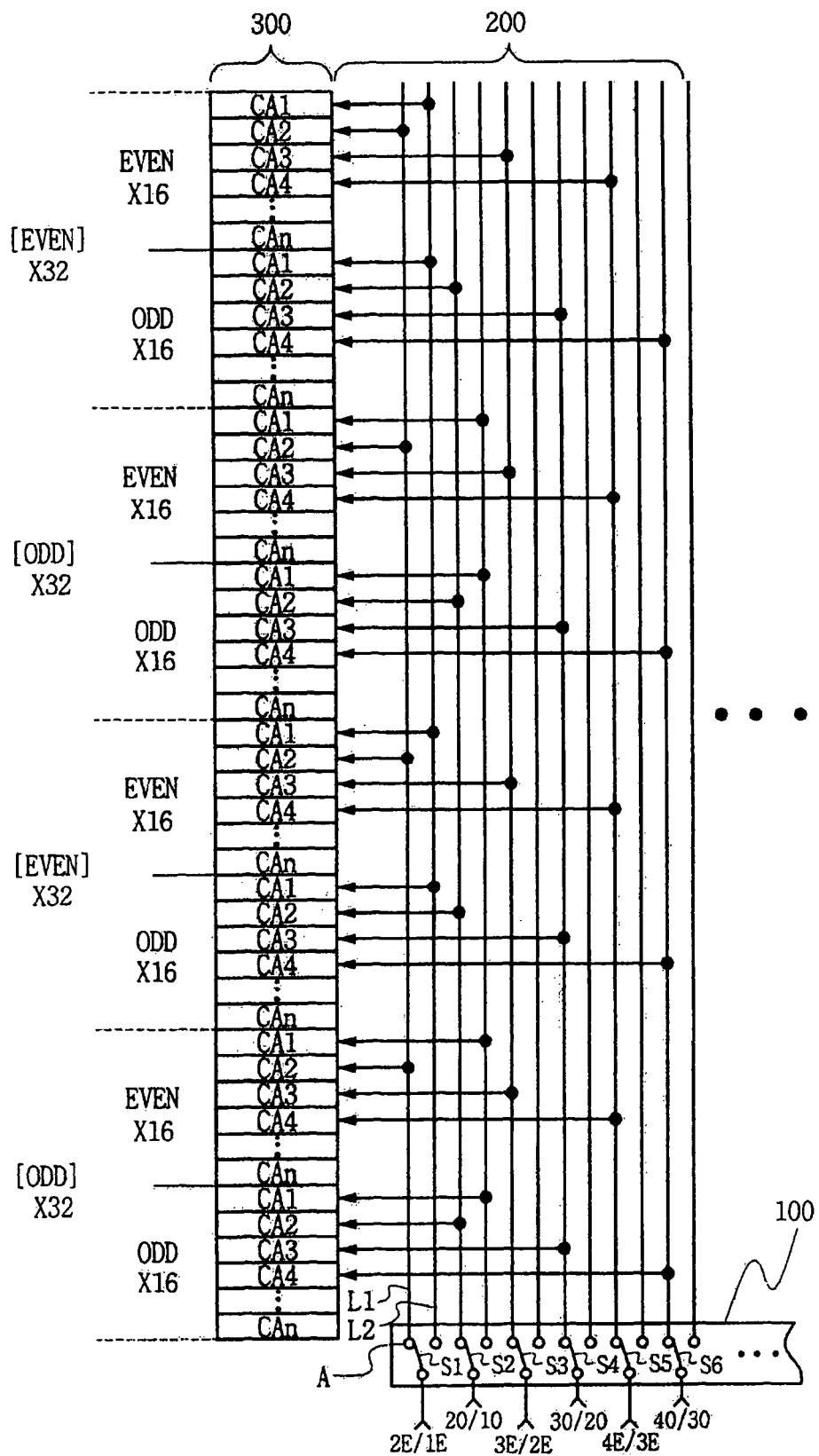

FIGS. 11 and 12 illustrate configurations of the address coding shifter of FIG. 9 according to other example embodiments of the present invention.

In the example embodiment of FIG. 9, the multipath accessible semiconductor memory device may include an address coding shifter ACS 500. The address coding shifter ACS 500 may participate in bit shifting a column address of x16 or x32 applied in a read operation according, to a magnitude of data input/output bit, as shown in the table 10b of FIG. 10.

In the example embodiment of FIG. 10, the table 10b illustrates a corresponding conversion of column address in reading, by x32, data stored in x16. A column address CA2 of x16 may be down shifted 1 bit so as to match or correspond to (e.g., align with) a column address CA1 of x32, CA3 may be matched to CA2, and CA4 may be matched to CA3. Further, CA9 may be matched to CA8, and CA1 may be matched to CA0. In an example, CA0 may be an exception to the general matching rule in that CA0 may not be matched to a column address of x32. The conventional table 10a of FIG. 10 illustrates a column address for a unit of respective operation without address matching (e.g., without shifting bits of a column address to convert between an x16 format and an x32 format). In reading data stored in a shared memory bank with respective peculiar column addresses as shown in the table 10a of FIG. 10, the results or compatibility illustrated in the lower portion of FIG. 7 may be achieved.

In the example embodiment of FIG. 10, the mapping of column addresses as shown in the table 10b may be implemented without a complex logic circuit. In an example, the interior of the address coding shifter ACS 500 may be embodied as a wiring structure in a semiconductor process, as shown in the example embodiments of FIG. 11 or 12.

In the example embodiment of FIG. 11, the address coding shifter ACS 500 of FIG. 9 may include a wiring structure 210 for x16 and a wiring structure 220 for x32. Thus, during a read operation in x32 (e.g., reading 32 bits at a time) as data stored in x16, a second column address bit 2E of an even column address may be changed to a first column address bit 1E of an even column address. Also, a second column address bit 2O of an odd column address may be changed to a first column address bit 1O of an odd column address. Further, a third column address bit 3E of an even column address may be changed to a second column address bit 2E of an even column address, and a third column address bit 3O of an odd column address may be changed to a second column address bit 2O of an odd column address. 4E may be changed to 3E, and 4O may be changed to 3O. In an example, column addresses may be divided into even and odd column addresses, and a wiring structure for CA2, CA3 and CA4 from the table 10b of FIG. 10 is shown in FIG. 11.

An example conversion for column addresses per first, second port will now be described with respect to the example embodiment of FIG. 12.

In the example embodiment of FIG. 12, a switching unit 100 may perform a switching operation (e.g., to switch between x16 and x32 formats, etc.), and the wiring structure 210 and the wiring structure 220 of FIG. 11 may be combined within a wiring structure 200. A reference number 300 may indicate column address bits corresponding to bit data of memory cells. Four pairs of x16 data constructed of evens and odds may be also constructed of two pairs of x32 data for x32.

In the example embodiment of FIG. 12, during a read operation in a x32 format of data stored in x16, each of switches S1 to S6 in the switching unit 100 may be opened (e.g., detached) from a contact A, and may then be closed (e.g., connected to a contact on the "right" side of the "left" contact or A. As shown in the switching unit 100 of FIG. 12, switch S1 switches between 2E and 1E, switch S2 switches between 2O and 1O, switch S3 switches between 3E and 2E, switch S4 switches between 3O and 2O, switch S5 switches between 4E and 3E, and switch S6 switches between 4O and 3O, respectively. Thus, in an example, 2E (e.g., second column address bit of even column address) may be changed to 1E (e.g., via switch S1), 2O may be changed into 1O (e.g., via switch S2), 3E to 2E (e.g., via switch S3), 3O to 2O (e.g., via switch S4), 4E to 3E (e.g., via switch S5), and 4O to 3O (e.g., via switch S6). Consequently, such column address shifting may allow data read in DDRx16 and/or DDRx32 to be read (e.g., irrespective of a format in which the data is stored).

Returning to the example embodiment of FIG. 9, if the first processor 10 accesses the shared memory bank 4 through a first port A, the second processor 12 may concurrently (e.g., simultaneously) access another memory bank through the second port B. In an example, a multipath access operation may be obtained via an access path forming unit including a path decision unit 201, as shown in the example embodiment of FIG. 9.

In the example embodiment of FIG. 9, in an example, the shared memory bank 4 may be accessible by each of the first and second processors 10 and 12, a global input/output line GIO in the shared memory bank 4 may be selectively connected to one of the first and second ports A and B each connected corresponding to the first and second processors 10 and 12. In an example, the selective connection may be obtained through a control of the path decision unit 201.

In the example embodiment of FIG. 9, the path decision unit 201 may logically combine external signals and may generate a path decision signal PRB_MA, PRB_MB. The external signals applied to the path decision unit 200 may include a row address strobe signal RASB, a write enable signal WEB and a bank selection address BA individually applied through the first and second ports A and B. Row and column address multiplexers 28 and 38 may collectively constitute an access path forming unit including the path decision unit 201. The row and column address multiplexers 28 and 38 may select one row and column address A_ADD, A_CADD from row and column addresses A_ADD, B_ADD, A_CADD and B_CADD each applied through the first and second ports A and B, respectively, in response to the path decision signal PRB_MA, PRB_MB, and may apply the selected row and column address to row decoder 30 and column decoder 40, respectively, connected to the shared memory bank 4.

In the example embodiment of FIG. 9, an input/output related path unit may include first and second multiplexers 120 and 121 for connecting a global input/output line pair GIO, GIOB of the shared memory bank 4 with a first data input/output line pair DIO,DIOB:WDIO,WDIOB, and the global input/output line pair GIO, GIOB of the shared memory bank 4 with a second data input/output line pair, in response to the path decision signal PRB_MA, PRB_MB. First input/output related circuits 130, 300 and 400 may be positioned between the first global multiplexer 120 and the first port A, and second input/output related circuits 131, 310 and 410 may be positioned between the second global multiplexer 121 and the second port B.

In the example embodiment of FIG. 9, a plurality of memory cells may be disposed in a matrix type of rows and columns of the shared memory bank 4. In an example, the plurality of memory cells may include one or more DRAM memory cells MC, each including one access transistor AT and a storage capacitor C as shown in the example embodiment of FIG. 9.

In the example embodiment of FIG. 9, the shared memory bank 4 may include two input/output sense amplifier and write drivers 130 and 131, and the first and second global multiplexers 120 and 121 may perform mutually opposed switching operations.

In the example embodiment of FIG. 9, the first and second processors 10 and 12 may use, in common in during concurrent access operations, circuit devices and lines positioned between the global input/output line pair GIO, GIOB and a memory cell MC, and may further independently (e.g., separately) use input/output related circuit devices and lines provided from each port to the global multiplexer 120, 121.

In the example embodiment of FIG. 9, the first and second processors 10 and 12 may share access to each of a global input/output line pair GIO, GIOB of the shared memory bank 4, a local input/output line pair LIO, LIOB operationally connected to the global input/output line pair, a bit line pair BLi, BLBi operationally connected to the local input/output line pair through a column selection signal CSL, a bit line sense amplifier 5 adapted on the bit line pair, for sensing and amplifying data of the bit line, and a memory cell MC coupled to an access transistor AT (e.g., which may constitute a memory cell on the bit line pair), through the first and second ports.

In the example embodiment of FIG. 9, the address coding shifter ACS 500 may include a wiring structure, such as illustrated in the example embodiment of FIG. 12, to perform a bit shifting for a column address having a given data format or length (e.g., x16 or x32) applied in a read operation based on a data input/output bit (e.g., indicating an x16 format for the output data, an x32 format for the output data, etc.), and may apply the shifted bits to a column address multiplexer 38.

Figure 13:
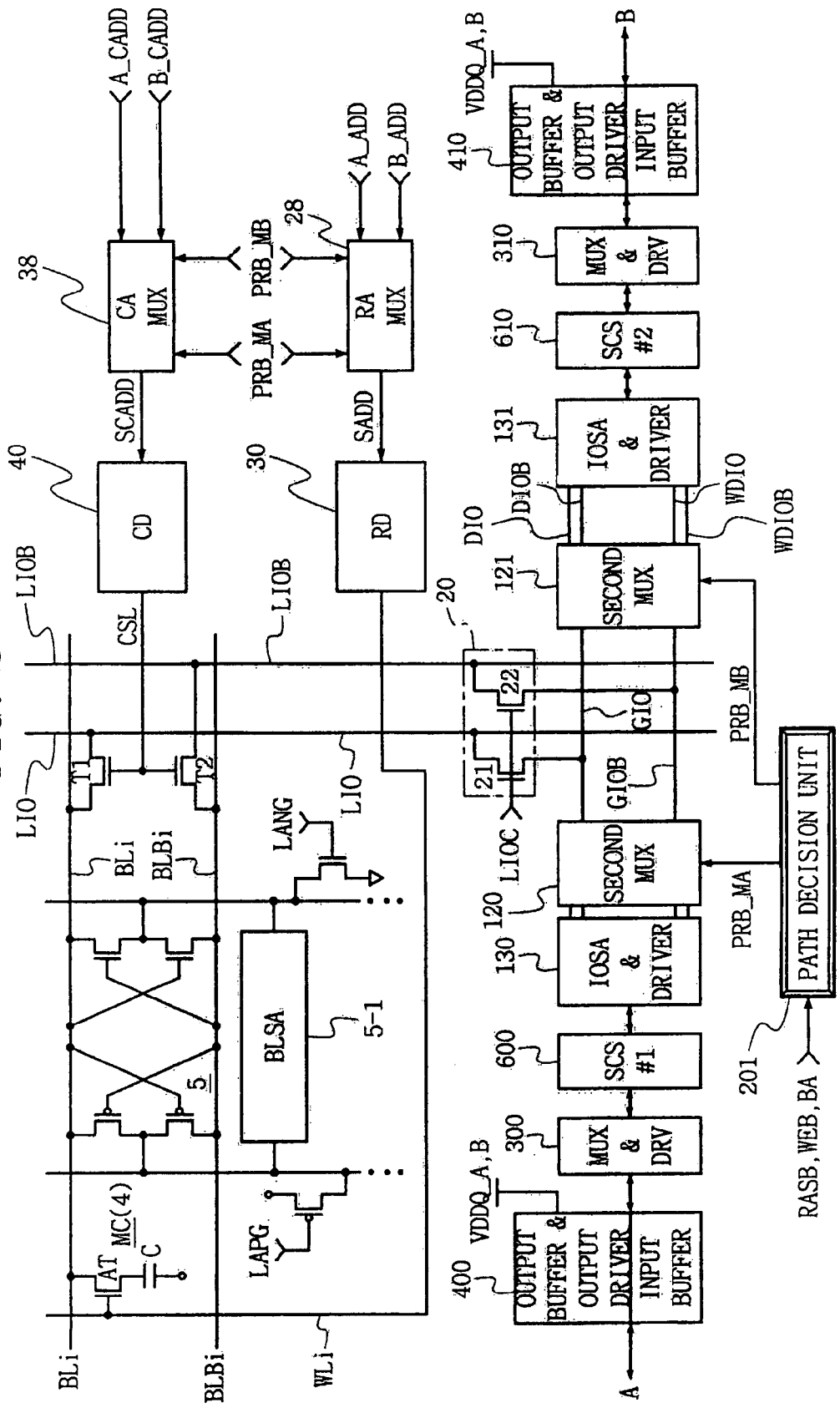
FIG. 13 is a block diagram illustrating a multipath accessible semiconductor memory device according to another example embodiment of the present invention.

FIG. 13 is a block diagram illustrating a multipath accessible semiconductor memory device according to another example embodiment of the present invention. In contrast to the example embodiment of FIG. 9, the address coding shifter ACS 500 need not be included in FIG. 13. Rather, first and second sense amplifier connection converters SCS #1,#2: 600,610 may be included and may be positioned corresponding to input/output sense amplifier and write drivers 130 and 131. In an example, to retrieve data at either x16 or x32, the first and second sense amplifier connection converters 600 and 610 may perform a mapping operation such that first and second data in output data of the sense amplifier may be combined sequentially, thereby attaining a conversion of the output connection.

Figure 14:
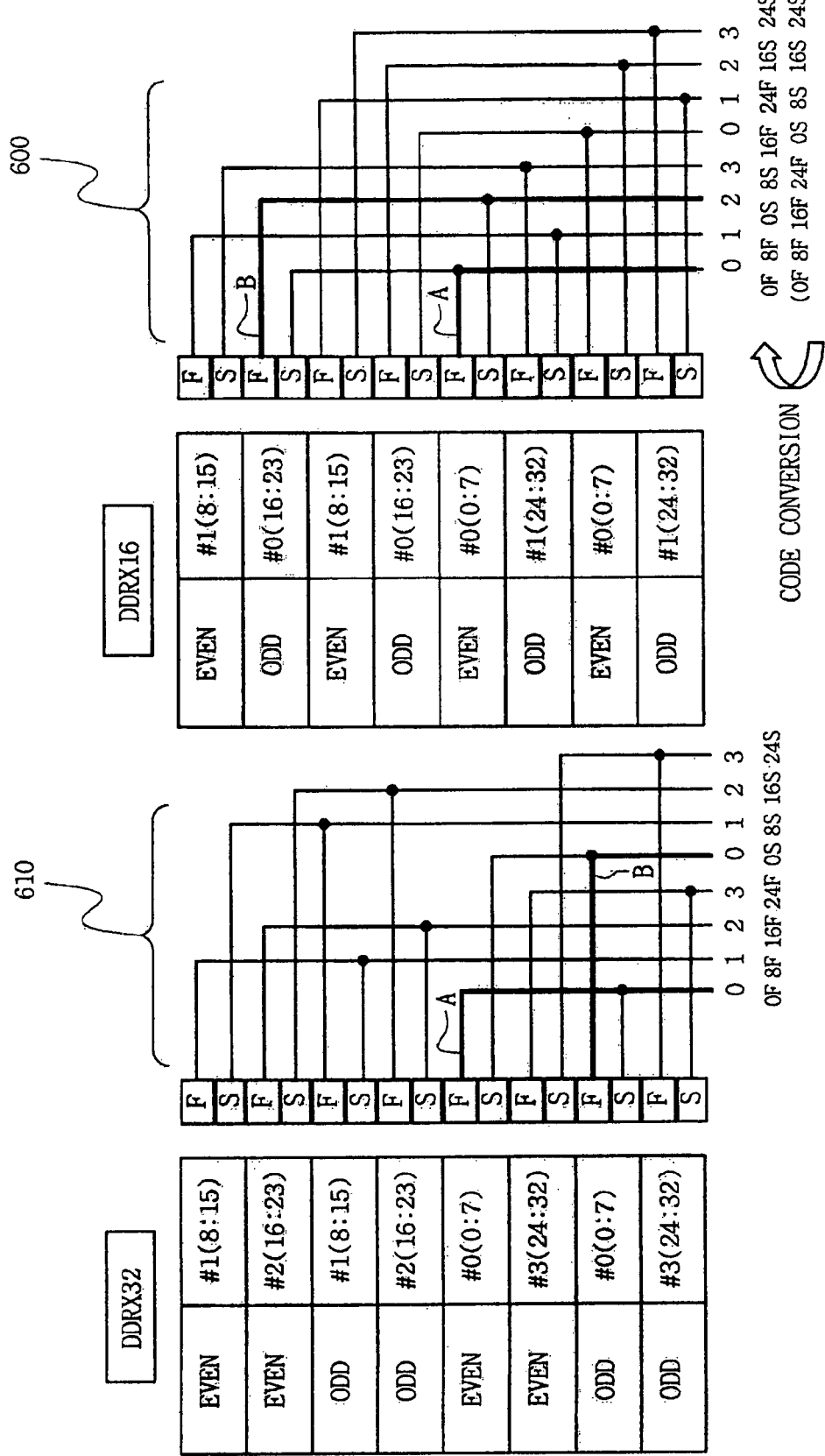
FIG. 14 illustrates a connection per port for a sense amplifier output connection converter according to another example embodiment of the present invention.

FIG. 14 illustrates a connection per port for the sense amplifier output connection converter of FIG. 13 according to another example embodiment of the present invention. In the example embodiment of FIG. 14, a wiring structure 610 may be adapted for x32, and a wiring structure 600 may be adapted for x16. In the example embodiment of FIG. 14, during a read operation requesting data in a format of x32, output 0F,8F, 16F,24F of the sense amplifier may constitute data of 32 bits, which may be output as a first data E0' (e.g., as shown in the example embodiment of FIG. 8). Further, outputs 0S, 8S, 16S and 24S of the sense amplifier may constitute 32 bit data, which may be output as a second data O1' (e.g., as shown in the example embodiment of FIG. 8). Lines A and B may each indicate starting data of first data and second data. An output 0F of the sense amplifier may be obtained as 8 bits from F connected to an even #0(0:7), and an output 8F of the sense amplifier may be obtained as 8 bits from F connected to an even #1(8:15). 16F may be obtained as 8 bits from F connected to an even #2(16:23), and 24F may be obtained from F connected to an even #3(24:32). In an example, F may indicate herein a first output data of the sense amplifier, and may correspond to the first data E0' (e.g., as shown in the example embodiment of FIG. 8).

In the example embodiment of FIG. 14, during a read operation requested data in a format of x16, responsive read data may be separated and outputted in an opposite direction to the direction of arrows AR1-AR4 of FIG. 8, such that an output connection may be changed or switched as illustrated in the wiring structure 600 of FIG. 14. For example, outputs 0F, 8F, 16F and 24F of the sense amplifier in x32 may each be converted into respectively corresponding 0F, 8F, 0S and 8S in x16. Also, 0S, 8S, 16S and 24S in x32 may be connected and converted into respectively corresponding 16F, 24F, 16S and 24S in x16. Likewise, F may be an abbreviation indicating a first data, and S may be an abbreviation indicating a second data. For example, 8F may indicate 8 bits to 15 bits of the first data, and 16F may indicate 16 bits to 23 bits of the first data.

In the example embodiment of FIG. 14, the output connection of the input/output sense amplifier to provide sense amplification output data may be configured to convert data between different data length formats (e.g., x16 and x32) based on a wiring structure which may be configured to "shift" bits of the respective data lengths to accommodate a device requesting data having a particular data length format.

Figure 15:
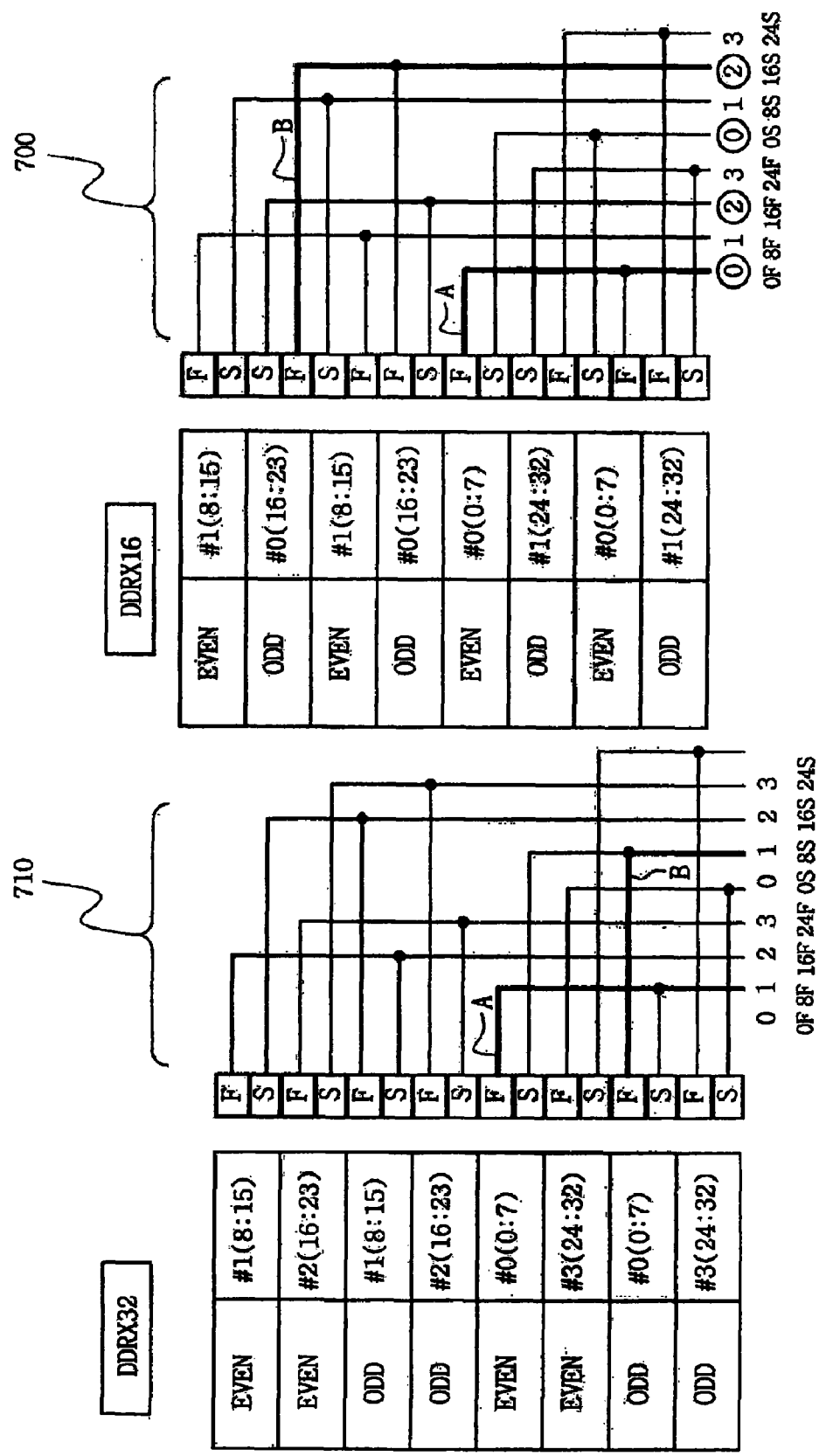
FIG. 15 illustrates a sequence change of data output in a multipath accessible semiconductor memory device according to another example embodiment of the present invention.

FIG. 15 illustrates a sequence change of data output in a multipath accessible semiconductor memory device according to another example embodiment of the present invention.

In the example embodiment of FIG. 15, an output sequence of input/output sense amplifier for providing sense amplification output data in a read operating mode may be adjusted or changed based on an applied external command (e.g., a mode register set(MRS, EMRS) signal). Thus, hardware for triggering a data length format change need not be included within an internal memory circuit. In wiring structures 710 and 700, wiring structure 710 may correspond to output data of x32, and wiring structure 700 may correspond to output data of x16. In an example, the wiring structures 710 and 700 may be the same, and the data output sequence may be changed based on whether the applied external command indicates to output data in x32 or x16.

In the example embodiment of FIG. 15, if the applied external command requests data in x16, an output 0F of the sense amplifier may be obtained as 8 bits from F connected to an even #0(0:7), and an output 8F of the sense amplifier may be obtained as 8 bits from F connected to an even #1(8:15). 16F may be obtained as 8 bits from S connected to an odd #0(16:23), and 24F may be obtained from S connected to an odd #1(24:32). Thus, 16F and 24F may correspond to 0S and 8S as shown in the example embodiment of FIG. 14. In other words, without a change in hardware, the data compatibility may be obtained by changing an output sequence in data outputs of 16 bits and 32 bits based on the applied external command.

In another example embodiment of the present invention, in a memory device including four memory areas, one of the memory areas may be configured as a "shared" memory area, and the three remaining memory areas may be designated as "private" memory areas (e.g., alternatively, each of the four memory areas may be shared memory areas, two of the four memory areas, etc.). A plurality of processors (e.g., two or more processors, with each processor having an I/O port for accessing one or more of the memory areas) may be further included, and may be configured to share access to the shared memory area(s), irrespective of whether the plurality of processors exchange data with the same data length format.

In another example embodiment of the present invention, a data compatibility of a shared memory bank may be obtained even if data is accessed by different data input/output bit units or data length formats. In addition, a data transmission and processing speed may be maintained or increased in a data processing system of a semiconductor memory device having a shared memory bank, and a system size may be reduced, which may thereby reduce a manufacturing cost of the memory device.

Example embodiments of the present invention being thus described, it will be obvious that the same may be varied in many ways. For example, while above-described example embodiments of the present invention provide examples where data compatibility is achieved for data length formats of x16 and x32, it is understood that other example embodiments of the present invention may be directed to any type of data length format (e.g., 8 bits/16 bits, 32 bits/64 bits, 64 bits/128 bits, etc.).

Further, while above-described example embodiments of the present invention have been provided as implemented with a DRAM, it is understood that other example embodiments of the present invention may be directed to any well-known memory device, such as a static random access memory (SRAM), a nonvolatile memory, etc.

Further, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A method of performing memory operations, comprising:
   storing data in a shared memory, the shared memory being shared by a first processor configured to exchange data with the shared memory in only a first data length format and second processor configured to exchange data with the shared memory in only a second data length format, the first data length format different from the second data length format;
   receiving a read command from one of the first and second processors; and
   outputting data from the shared memory in response to the read command based on which of the first and second data length formats is used by the processor issuing the read command,
   wherein the first and second processors are connected to the shared memory via first and second input/output ports, respectively, the first input/output port having a first number of bits based on the first data length format and the second input/output port having a second number of bits based on the second data length format, and
   the first processor applies a first column address signal through the first input/output port to read first data in the shared memory if the first processor issues the read command and the second processor applies a second column address signal through the second input/output port to read second data in the shared memory if the second processor issues the read command.

2. The method of claim 1, wherein the first data length format is associated with a data length of N bits, and the second data length is associated with a data length of 2N bits.

3. The method of claim 2, wherein N and 2N correspond to one of 8 and 16 bits, respectively, 16 and 32 bits, respectively, 32 and 64 bits, respectively, 64 and 128 bits respectively, and 128 and 256 bits, respectively.

4. The method of claim 1, wherein the outputting step includes shifting a bit of the first column address signal based on the first data length format if the first processor issues the read command.

5. The method of claim 4, wherein the shifting step shifts each bit of the first column address signal by one bit.

6. The method of claim 1, wherein the outputting step includes shifting a bit of the second column address signal based on the second data length format if the second processor issues the read command.

7. The method of claim 6, wherein the shifting step shifts each bit of the first column address signal by one bit.

8. The method of claim 1, wherein the outputting step includes shifting an output connection of an input/output sense amplifier based on the data length format of the processor issuing the read command.

9. The method of claim 8, wherein the first data length format is 2N bits and the second data length format is N bits, and the shifting of the output connection is configured to allow a sequential outputting of first and second data, each of the first and second data including N bits such that 2N bits of data are output to the first processor.

10. The method of claim 8, wherein the first data length format is N bits and the second data length format is 2N bits, and the shifting of the output connection is configured to allow a sequential outputting of first and second data, each of the first and second data including N bits such that 2N bits of data are output to the second processor.

11. The method of claim 1, further comprising:
    receiving an external command associated with a given data length format,
    wherein the outputting step includes adjusting an output sequence of an input/output sense amplifier based on the received external command, the input/output sense amplifier providing sense amplification output data during a real operation.

12. The method of claim 11, wherein the first data length format is associated with a data length of N bits, and the second data length is associated with a data length of 2N bits.

13. The method of claim 12, wherein N and 2N correspond to one of 8 and 16 bits, respectively, 16 and 32 bits, respectively, 32 and 64 bits, respectively, 64 and 128 bits respectively, and 128 and 256 bits, respectively.

14. The method of claim 13, wherein the adjustment to the output sequence is configured to perform an output mapping in order to conform with one of the first and second data length formats.

15. The method of claim 11, wherein the received external command is a mode register set command.

16. The method of claim 1, wherein the storing of the data in the shared memory includes storing data received from one of the first and second processors, and
    the outputting of the data from the shared memory includes outputting the data received from the one of the first and second processors to the other of the first and second processors.

17. A semiconductor memory device, comprising:
    a first processor configured to exchange data with a first data length format;
    a second processor configured to exchange data with a second data length format;
    a shared memory configured to store data, the shared memory being shared by the first and send processors, the shared memory further configured to receive a read command from at least one of the first and second processors and to output data in response to the read command based on which of the first and second data length formats is used by the processor issuing the read command; and
    an address coding shifter for shifting a bit of one of a first column address signal received from the first processor and a second column address signal received from the second processor during a read operation based on the data length format of the processor issuing the read command,
    wherein the first processor is configured to exchange data with the shared memory in only the first data length format, the second processor is configured to exchange data with the shared memory in only the second data length format, and the first data length format is different from the second data length format.

18. The semiconductor memory device of claim 17, wherein the address coding shifter shifts the bit in order to conform data output in response to the read command with the data length format of the processor issuing the read command.

19. The semiconductor memory device of claim 17, wherein the shared memory is connected to the first processor with a first port and the shared memory is further connected to the second processor with a second port, a number of bits associated with the first port corresponding to the first data length format and a number of bits associated with the second port corresponding to the second data length format.

20. The semiconductor memory device of claim 19, wherein N bits correspond to the first data length format and 2N bits correspond to the second data length format.

21. The semiconductor memory device of claim 20, wherein N and 2N correspond to one of 8 and 16 bits, respectively, 16 and 32 bits, respectively, 32 and 64 bits, respectively, 64 and 128 bits respectively, and 128 and 256 bits, respectively.

22. The semiconductor memory device of claim 19, wherein 2N bits correspond to the first data length format and N bits correspond to the second data length format.

23. The semiconductor memory device of claim 22, wherein N and 2N correspond to one of 8 and 16 bits, respectively, 16 and 32 bits, respectively, 32 and 64 bits, respectively, 64 and 128 bits respectively, and 128 and 256 bits, respectively.

24. The semiconductor memory device of claim 17, wherein the bit shifting of the address coding shifter shifts 1 bit of the respective column address signal.

25. The semiconductor memory device of claim 17, further comprising:
a connection converter for converting an output connection of an input/output sense amplifier based on the data length format of the processor issuing the read command.

26. The semiconductor memory device of claim 25, wherein the connection converter converts the output connection to align data stored in the shared memory with the data length format of the processor issuing the read command.

27. The semiconductor memory device of claim 17, further comprising:
a sequence changing unit for changing an output sequence of an input/output sense amplifier in response to an external command during a read operation.

28. The semiconductor memory device of claim 27, wherein the sequence changing unit changes the output sequences to align data stored in the shared memory with the data length format of the processor issuing the read command.

29. The semiconductor memory device of claim 27, wherein the sequence changing unit changes the output sequence to perform an output mapping to change a sequential combination of first data and second data in sense amplification output data.

30. The semiconductor memory device of claim 27, wherein the external command is a mode register set command.

31. A method of performing memory operations, comprising:
storing data received in a first data length format from one of first and second processors in a shared memory;
receiving read command from one of the first and second processors; and
outputting the data from the shared memory in a second data length format in response to the read command, the second data length format different from the first data length format,
wherein the first and second processors are connected to the shared memory via first and second input/output ports, respectively, the first input/output port having a first number of bits based on the first data length format and the second input/output port having a second number of bits based on the second data length format, and
the first processor applies a first column address signal through the first input/output port to read first data in the shared memory if the first processor issues the read command and the second processor applies a second column address signal through the second input/output port to read second data in the shared memory if the second processor issues the read command.

* * * * *